(12) United States Patent
Becker et al.

(10) Patent No.: US 9,077,318 B2
(45) Date of Patent: Jul. 7, 2015

(54) LOCKING DEVICE FOR ADJUSTING ELEMENT

(71) Applicant: Phoenix Contact GmbH & Co. KG, Blomberg (DE)

(72) Inventors: Markus Becker, Paderborn (DE); Rainer Gockel, Bad Pyrmont (DE); Daniel Klein, Blomberg (DE); Frank Hakemeyer, Horn-Bad Meinberg (DE); Christian Starke, Lemgo (DE); Jürgen Kleinschmidt, Detmold (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 13/871,608

(22) Filed: Apr. 26, 2013

(65) Prior Publication Data
US 2013/0327165 A1    Dec. 12, 2013

Related U.S. Application Data

(63) Continuation of application No. PCT/EP2011/005397, filed on Oct. 26, 2011, and a continuation of application No. 13/129,173, filed as application No. PCT/EP2009/008182 on Nov. 17, 2009.

(51) Int. Cl.
*H01H 13/62* (2006.01)
*H03J 1/06* (2006.01)
(Continued)

(52) U.S. Cl.
CPC . *H03J 1/06* (2013.01); *G04C 23/46* (2013.01); *H01H 19/001* (2013.01); *H01H 19/025* (2013.01); *H01H 19/03* (2013.01); *H01H 19/585* (2013.01)

(58) Field of Classification Search
USPC ......... 200/11 TW, 11 R, 308–317, 179, 11 G, 200/6 BB, 19.07, 19.18, 336; 29/52, 148, 29/231, 300, 314, 384, 373, 379.4; 74/395–397, 405, 406, 409
See application file for complete search history.

(56) References Cited

U.S. PATENT DOCUMENTS 3,031,541 A    4/1962   Hoffmann
3,286,047 A    11/1966  Heide
(Continued)

FOREIGN PATENT DOCUMENTS

AT    212427 B      12/1960
CN    100137941 A   3/2008
(Continued)

OTHER PUBLICATIONS

German Office Action; Mailed Jun. 30, 2011 for the related DE Application No. 10 2010 049 476.
(Continued)

*Primary Examiner* — Edwin A. Leon
*Assistant Examiner* — Anthony R. Jimenez
(74) *Attorney, Agent, or Firm* — Mendelsohn, Drucker & Dunleavy, P.C.; David L. Cargille

(57) ABSTRACT

The invention relates to a device for locking an adjusting means (5), in particular an electrical addressing device, mounted on a printed circuit board (1) which extends in an x and/or y direction. The device includes an essentially flat base plate (2) having a length (L), a width (B), and a thickness (D), to which a first detent spring (4) is attached for locking engagement with marking means (23, 23') of the adjusting means (5). The first detent spring preferably has an oblong spring leg (7), wherein in the installed state the base plate (2) is mounted on the printed circuit board (1).

25 Claims, 13 Drawing Sheets

(51) Int. Cl.
*G04C 23/46* (2006.01)
*H01H 19/00* (2006.01)
*H01H 19/02* (2006.01)
*H01H 19/03* (2006.01)
*H01H 19/58* (2006.01)

(56) References Cited

U.S. PATENT DOCUMENTS

| | | | |
|---|---|---|---|
| 3,536,877 | A | 10/1970 | Von Fange et al. |
| 3,621,162 | A | 11/1971 | Wall |
| 3,818,155 | A | 6/1974 | Lockard |
| 4,131,771 | A | 12/1978 | Erickson et al. |
| 4,190,749 | A | 2/1980 | Erickson et al. |
| 4,395,610 | A | 7/1983 | Downs et al. |
| 5,570,777 | A | 11/1996 | Skarivoda |
| 5,927,486 | A | 7/1999 | Kamiya |
| 6,236,002 | B1 | 5/2001 | Chou |
| 7,223,926 | B1 | 5/2007 | Gannon et al. |
| 7,474,593 | B2 | 1/2009 | Pearson |
| 7,728,240 | B2 | 6/2010 | Dodal et al. |
| 2006/0082558 | A1 | 4/2006 | Chen et al. |
| 2008/0289941 | A1* | 11/2008 | Kang et al. ................ 200/336 |
| 2011/0211355 | A1 | 9/2011 | Hakemeyer et al. |

FOREIGN PATENT DOCUMENTS

| | | |
|---|---|---|
| CN | 201084650 Y | 7/2008 |
| DE | 1921230 A1 | 2/1971 |
| DE | 2521789 A1 | 11/1976 |
| DE | 2928558 A1 | 1/1981 |
| DE | 4308242 C1 | 4/1995 |
| DE | 19807912 A1 | 8/1998 |
| DE | 102006034164 A1 | 11/2007 |
| DE | 102008057748 A1 | 5/2010 |
| EP | 0050861 A2 | 5/1982 |
| EP | 0235320 A1 | 9/1987 |
| EP | 0312282 A2 | 10/1988 |
| WO | WO2010054854 A1 | 5/2010 |
| WO | WO2012055549 A1 | 5/2012 |

OTHER PUBLICATIONS

International Search Report and Written Opinion; Mailed Feb. 7, 2012 for the related PCT Application No. PCT/EP2011/005397.
European Search Report; Mailed Feb. 6, 2012 for the related EP Application No. 11008582.6.
International Preliminary Report on Patentability; Mailed May 10, 2013 for the related PCT Application No. PCT/EP2011/005397.
Chinese Office Action; Mailed May 6, 2013 for related CN Application No. CN 200980145950.0.
International Preliminary Report on Patentability and Written Opinion; Mailed May 26, 2011 for related PCT Application No. PCT/EP2009/008182.
German Office Action; Mailed Sep. 13, 2010 for the related DE Application No. 10 2008 057 748.0.
Non-Final Office Action; Mailed Sep. 9, 2014 for related U.S. Appl. No. 13/129,173.
Final Office Action; Mailed Apr. 8, 2014 for related U.S. Appl. No. 13/129,173.
Notice of Allowance; Mailed Nov. 24, 2014 for corresponding U.S. Appl. No. 13/129,173.

* cited by examiner

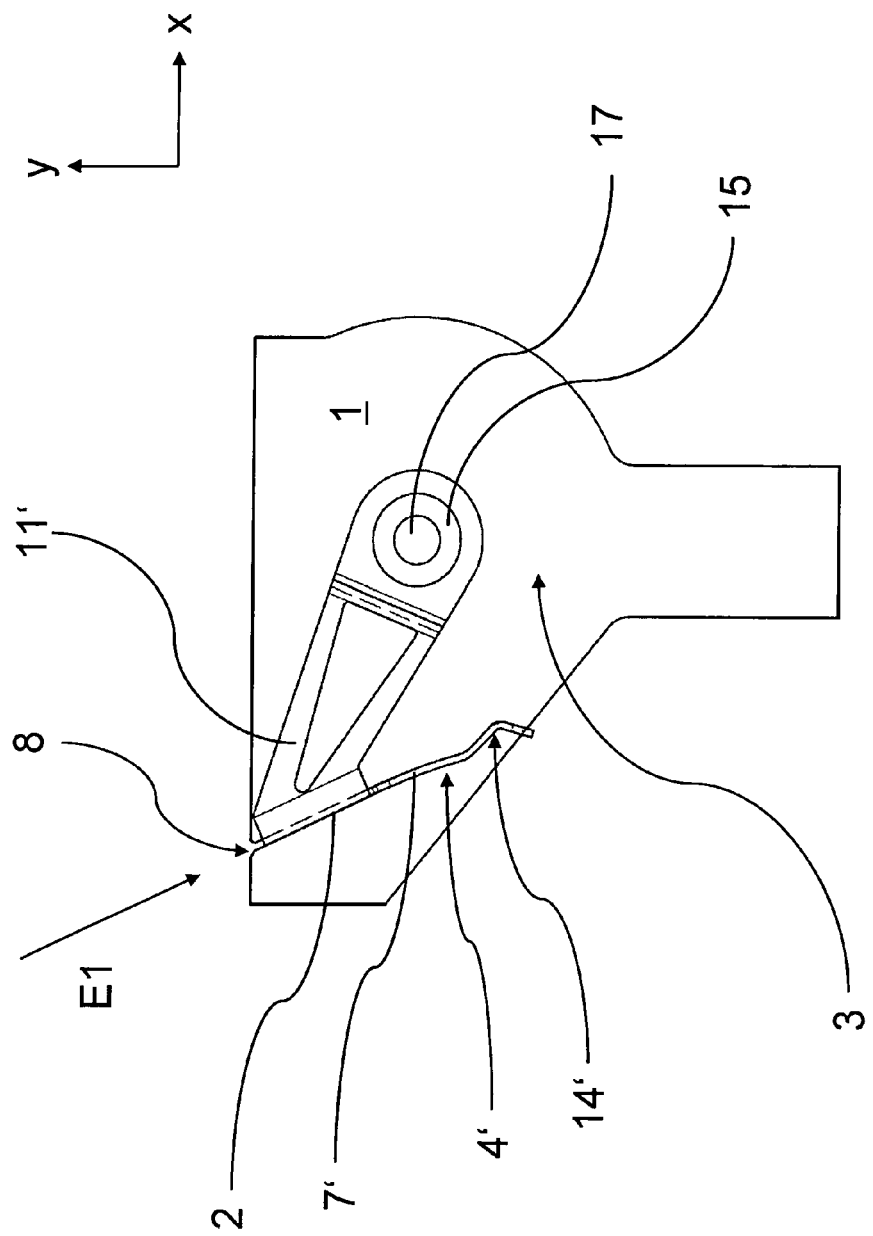

LOCKING DEVICE FOR ADJUSTING ELEMENT

CROSS-REFERENCE TO RELATED APPLICATIONS

This application is (i) a continuation of International Application No. PCT/EP2011/005397, filed Oct. 26, 2011, which claims priority to German Patent Application No. DE 10 2010 049 476.3, filed Oct. 27, 2010, and (ii) a continuation of U.S. patent application Ser. No. 13/129,173, which is the National Stage of International Application No. PCT/EP2009/008182, filed Nov. 17, 2009, and which claims priority to German Patent Application No. DE 10 2008 057 748.0, filed Nov. 17, 2008, the teachings of all of which applications are incorporated herein by reference.

FIELD OF THE INVENTION

The invention relates to a locking device of adjusting means, in particular adjusting means for electrical components situated on electric boards or electric printed circuit boards, preferably of electrical addressing devices, in particular corresponding to patent application WO 2010/054854 A1 or patent application DE 10 2010 049 476.3, whose priority is claimed.

BACKGROUND

Adjusting means for adjustable electrical components of the generic type, for example suited for manually adjusting electrical resistance potentiometers, rotary potentiometers, or variable capacitors used for changing electrical parameters of electrical circuit arrangements, are usually designed as control dials, thumbwheels, rotary switches, levers, mechanical switches, buttons, slide switches, or the like.

Adjusting means for addressing devices according to the above-cited patent applications are used primarily for adjusting the addressing of bus users in data transmission systems or of electrical consumers in switching or control systems, also in wireless modules, for example. These types of adjusting means are usually installed in externally accessible module elements of these systems to allow setting of the address. The address is typically set using rotary coding switches, dip switches, or slide switches which are accommodated on printed circuit boards. For setting the address code of the address to be set, a marking of a number or a number sequence is usually selected using an adjusting means designed as a thumbwheel, for example, whereby in the case of rotary coding switches a decimal number or hexadecimal number is typically set.

Adjusting means, in particular of electrical addressing devices, are usually provided with a detent means or a detent mechanism so that a user may precisely set and/or fix the position of the adjusting means, i.e., an address code.

The publication WO 2010/054854 A1 describes locking to an electrical terminal module having an addressing function, having an electrical adjustable component on a printed circuit board with a thumbwheel, situated thereabove as an adjusting means, for manually setting an address code. For locking the thumbwheel using a detent means, a cylindrical projecting engaging means which is able to engage in holes in the side face of the thumbwheel is mounted on the printed circuit board.

In these types of positive-fit locks, precise locking may be difficult, in particular when the adjusting means is moved very quickly, as the result of which the cylindrical engaging means cannot engage sufficiently quickly in the holes of the adjusting means. In addition, the reliable, precise address setting using this type of positive-fit lock requires particularly high manufacturing precision, in particular regarding the bearing of the adjusting means and the component tolerances.

SUMMARY OF THE INVENTION

The object of the invention, therefore, is to provide an improved device for locking, in particular for electrical addressing devices. In addition, it is the aim that such a device may be easily and inexpensively installed and attached.

The object is achieved by a locking device having the features of main Claim 1.

Advantageous and/or preferred embodiments and refinements are the subject matter of the subclaims.

Accordingly, important advantages of the invention and its individual embodiments or refinements are based on the fact that the device has precise and reliable locking of the adjusting means. In addition, the device according to the invention allows a small installation height of an adjusting means mounted on a printed circuit board, and simple and rapid access to the components, resulting in options for easy replaceability and improved installation. In addition, the locking device according to the invention avoids a pressure load on one side of the adjusting means, and thus allows a uniform force load on the adjusting means.

Accordingly, the object of the invention is achieved by a locking device for locking an adjusting means which is mounted on a printed circuit board which extends in an x and a y direction, also referred to below and in the claims as the x-y direction, in particular an adjusting means of an electrical addressing device, the locking device including an essentially flat base plate having a length, a width, and a thickness, to which a first detent spring is attached for locking engagement with marking means of the adjusting means, the first detent spring preferably having an oblong spring leg, wherein in the installed state the base plate is mounted on the printed circuit board.

The printed circuit board extending in the x-y direction has an electrical circuit arrangement having at least one electrical adjustable component, such as a rotary potentiometer or a variable capacitor, which allows the adjustment of an electrical variable using an adjusting means.

According to the invention, the adjusting means is locked via a device which includes an essentially flat base plate having a thickness which extends in a length and a width, whereby the extension of the base plate does not necessarily have to be at right angles, but, rather, may have any desired geometry.

Furthermore, according to the invention a first detent spring is mounted on the base plate and preferably has an oblong spring leg, preferably in the form of a rectangular leaf spring. In one preferred embodiment of the invention, the first detent spring is designed as a sheet metal spring.

In another preferred embodiment of the invention, for locking engagement an engaging means having a design that is complementary to the marking means is mounted on the first detent spring, the engaging means being able to cooperate with the marking means, preferably recesses or elevations on the adjusting means, for locking engagement.

According to the invention, the base plate of the device may be mounted on the printed circuit board, in particular in a recess in the printed circuit board, and may also be installed with pretension on the printed circuit board. For this purpose, the installed base plate may be attached using standard fastening means, for example riveting or screwing. The base plate of the device is preferably attached to the printed circuit board, without fastening means, by pushing or inserting it into a recess in the printed circuit board, in particular a slitted groove in the surface of the printed circuit board or in a printed circuit board cutout, whereby the base plate may also be attached by means of pretensioning.

In another preferred embodiment of the invention, the first detent spring is designed in such a way that the elastic force of the first detent spring acts essentially perpendicularly with respect to the plane of the base plate which is defined by its length and width, such as a rectangular leaf spring in particular, which extends parallel to the plane of the base plate of the device according to the invention.

In one preferred embodiment, the detent spring has an oblong spring leg which is mounted on the base plate, on the end face in an extension of a longitudinal side, and is situated at a corner of the base plate, oriented transversely, preferably at right angles, with respect to the broad side of the base plate.

In another embodiment of the invention, an oblong recess, in particular in the form of a slit or a groove which passes through the printed circuit board, is introduced in the printed circuit board, and extends into the printed circuit board from an outer edge of the printed circuit board in an insertion direction in the x and/or y direction of the printed circuit board. The base plate of the device according to the invention is inserted into at least a portion of this recess.

For installing the base plate on the printed circuit board, the base plate is pushed in or inserted with at least a portion of its length into the printed circuit board in the insertion direction, and is preferably fixed in the recess by clamping and/or pretensioning, or is attached therein via fastening means.

In the installed state, the plane of the base plate of the device according to the invention extends transversely, preferably perpendicularly, and thus in the z direction, with respect to the plane of the printed circuit board.

To allow advantageous fixing of the base plate in the printed circuit board, in one advantageous embodiment of the invention the length of the oblong recess in the printed circuit board is advantageously at least the length of the base plate, and/or the width of the base plate is at least the thickness of the printed circuit board, and/or the width of the oblong recess in the printed circuit board is at least the thickness of the base plate.

According to another feature of the invention, the adjusting means is designed as a rotatable adjusting means, in particular as a thumbwheel, the insertion direction of the oblong recess preferably being oriented essentially tangentially with respect to the circular periphery of the rotatable adjusting means, thus allowing a right-angled configuration of the detent spring on the printed circuit board with respect to the center, and thus the rotational axis, of the rotatable adjusting means, so that the force vector of the spring leg of the detent spring is perpendicular to the circular periphery of the rotatable adjusting means.

In one preferred embodiment, the rotatable adjusting means has a bearing in the center, by means of which the adjusting means may be rotatably supported on the printed circuit board and also attached to the printed circuit board via a rivet which during installation is to be pushed through the bearing and through a hole in the printed circuit board.

In one advantageous embodiment, at least a portion of the base plate has a material projection which is bent transversely with respect to the plane of the base plate, as the result of which the base plate itself is reinforceable and/or may be fixed to the printed circuit board in the z direction. This type of material projection is advantageously mounted on one or both longitudinal sides of the base plate of the device according to the invention.

In one particularly advantageous embodiment of the invention, this type of material projection on the base plate of the device rotatably guides and/or supports the adjusting means and/or fixes the adjusting means, preferably a thumbwheel, on a rotational axis. For the rotatable guiding, a material projection which is bent on a longitudinal side of the base plate may be formed in the shape of a wing which extends essentially parallel to the plane of the printed circuit board on one side in such a way that the wing overlaps an adjusting means situated on this side, and has a hole for accommodating and guiding a bearing of this adjusting means.

In another embodiment of the invention, the marking means of the adjusting means are formed as marking recesses, at least one detent spring having a protruding engaging means which corresponds to such a marking recess. In an alternative embodiment, the marking means may be formed as marking projections, at least one detent spring having a receiving engaging means which corresponds to a marking projection.

In another preferred embodiment, the detent spring situated on the base plate of the device according to the invention, including the base plate and the engaging means, is designed as a stamped-bent part, in particular made of sheet metal or plastic.

In another embodiment, for pretensioning in the oblong recess in the printed circuit board the base plate has a spring clamping tab oriented transversely with respect to the insertion direction, this spring clamping tab preferably being formed from the base plate so that this base plate has an inner recess.

The spring clamping tab is advantageously oriented in a direction facing away from the adjusting means, preferably in the x and/or y direction, so that the spring action of the spring clamping tab acts against an inner surface in the oblong recess facing away from the adjusting means, and thus against the elastic force of the detent spring, whose elastic force meanwhile acts on the adjusting means.

In one particularly preferred embodiment of the invention, the inner surfaces of the oblong recess in the printed circuit board are provided with a profile that has a step-like or stair-like or also a wave-like design, for example also in a slightly S-shaped manner. In particular, this type of profile is situated along the x-y plane of the printed circuit board, so that the inner surfaces of the oblong recess are also oriented essentially in the z direction.

In another, improved embodiment, this profile of the oblong recess may be refined in such a way that the inner surfaces also form planes that are parallel to the insertion direction of the base plate.

Planes that are formed parallel to the insertion direction of the base plate advantageously alternate with planes that are oriented in the direction of the adjusting means and/or tangentially with respect to the circular periphery of an adjusting means having a rotatable design. Both oppositely situated inner surfaces of the oblong recess are preferably provided with a profile that has a step-like or stair-like or also a wave-like design, for example also in a slightly S-shaped manner.

According to another feature of the invention, the number of planes formed by the inner surfaces at two opposite inner surfaces of the oblong recess is different.

It is particularly advantageous that the base plate of the device according to the invention may be fixed with pretension in the printed circuit board when the minimum distance between two planes which are formed at opposite inner surfaces of the oblong recess, and are offset relative to one another but parallel to the insertion direction, essentially corresponds to the thickness of the base plate. In such an embodiment of the invention, the above-described spring clamping tab may advantageously abut against a third plane which is likewise oriented parallel to the insertion direction, and which is situated on the inner surface in the oblong recess facing the adjusting means and is configured for optimized pretensioning in such a way that it is present in the insertion direction in front of the plane on the same inner surface which also determines the minimum distance.

The width of the oblong recess in the insertion direction may also advantageously extend in a tapered and/or conical manner, so that during the insertion, i.e., in the installation of the base plate in the oblong recess, the pretensioning against a spring clamping tab mounted on the base plate is additionally increased.

In another embodiment of the invention, a second detent spring for a second adjusting means is mounted on the base plate of the device according to the invention, and is situated on the opposite side of the printed circuit board. As a result, such a second detent spring is situated on the side of the base plate opposite from the first detent spring, and otherwise may be essentially identical to the first detent spring in order to cooperate with marking means of the second adjusting means for locking engagement. However, it is pointed out that the dimensions and/or bearings of the two adjusting means and/or their marking means may definitely also have different designs, so that the two detent springs also have correspondingly different dimensions.

The distance between the two detent springs on the base plate preferably corresponds essentially to the thickness of the printed circuit board, so that the base plate may already be fixed by the detent springs in the z direction.

BRIEF DESCRIPTION OF THE DRAWINGS

The locking device according to the invention is described below in preferred embodiments. The drawings show the following:

FIG. 13: shows the printed circuit board of the locking device according to FIG. 9 in a side view, without adjusting means.

DETAILED DESCRIPTION

Figure 1:
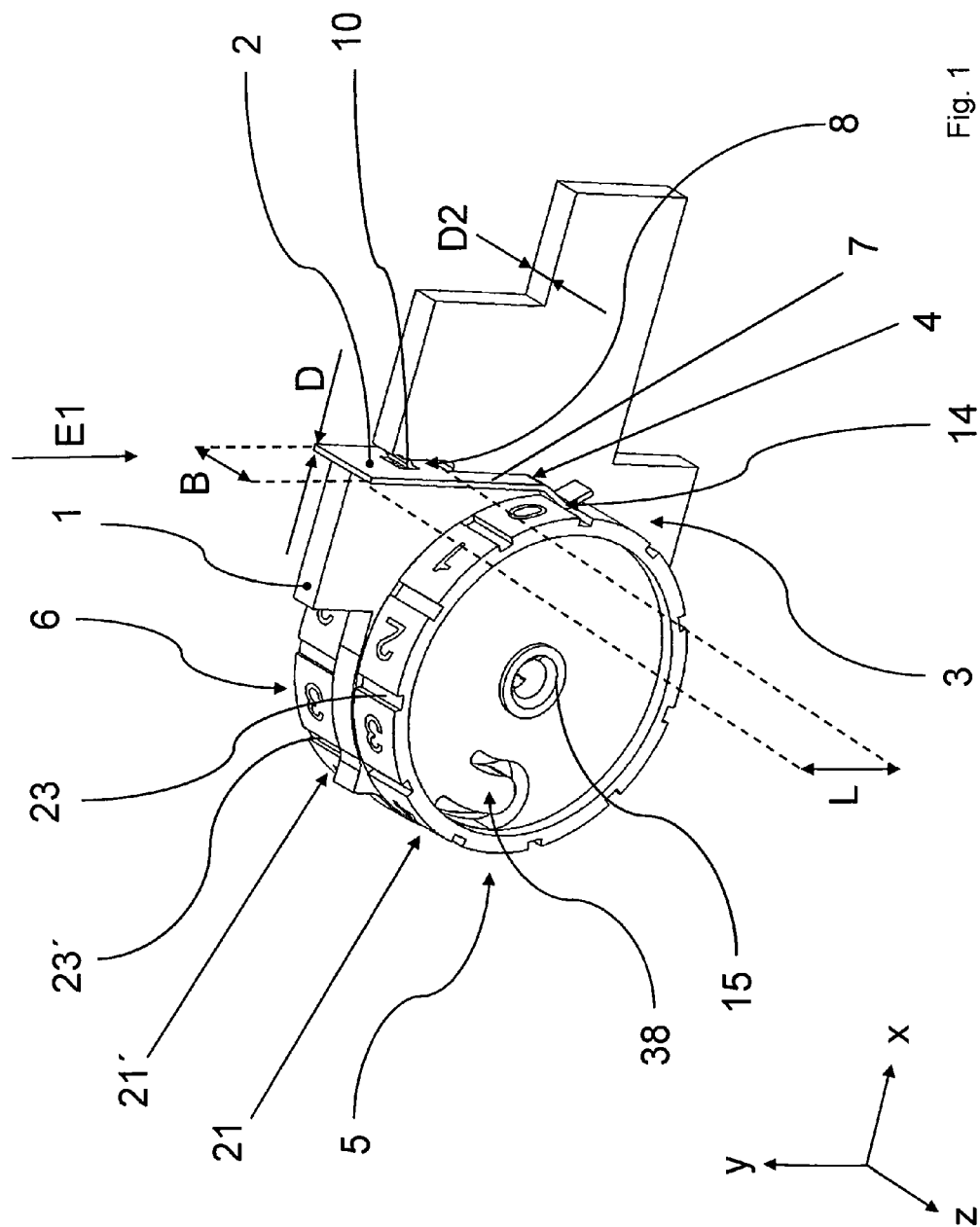
FIG. 1: shows a first embodiment of a locking device according to the invention in a perspective view.

The invention is explained in greater detail below based on exemplary embodiments and with reference to the figures, wherein features of various embodiments may be combined with one another, and identical or functionally equivalent features are provided with the same reference numerals in the figures.

FIG. 1 shows a first embodiment of the locking device according to the invention for locking two adjusting means (5, 6) of an addressing device which are situated on a printed circuit board (1).

Each of the two opposite sides of the printed circuit board (1) extending in the x-y plane has a circuit arrangement (3) having an adjustable electrical component (not shown) which may be adjusted by adjusting means (5, 6) to allow addressing to be set. The adjusting means (5, 6) are rotatable and designed as thumbwheels by way of example. A rotatable adjusting means advantageously has a bearing in the center via which the adjusting means may be rotatably supported on the printed circuit board, and which may also be attached to the printed circuit board by means of a rivet, for example, which during installation is to be pushed through the bearing and through a hole in the printed circuit board.

Markings (21, 21'), preferably in number format, are affixed in each case to the peripheral surfaces of the adjusting means (5, 6). The two adjusting means are each rotatably supported on and attached to the printed circuit board by a bearing (15).

To lock the two adjusting means (5, 6), the first embodiment of a locking device according to the invention has an essentially flat base plate (2) with a first detent spring (4) and a second detent spring (4') situated thereon, the second detent spring (4') not being shown in FIG. 1.

Due to the two adjusting means situated on the opposite sides of the printed circuit board, the detent springs are consequently also situated on opposite sides of the base plate, and may otherwise have essentially identical designs. The following description, even when it is limited to the description of the arrangement for locking an adjusting means on one side of the printed circuit board, also applies in principle to an arrangement for locking an adjusting means on the opposite side of the printed circuit board. However, it is pointed out that the dimensions and/or bearings of the two adjusting means and/or their marking means may definitely also have different designs, so that the two detent springs also have correspondingly different dimensions.

Each detent spring (4, 4') has an oblong spring leg (7) which extends parallel to the plane of the base plate, the elastic force of the detent spring (4, 4') acting perpendicularly with respect to the plane of the base plate. The oblong spring leg is mounted on the base plate, on the end face in an extension of a longitudinal side, and is situated at a corner of the base plate, oriented transversely, preferably at right angles, with respect to the broad side of the base plate. On the spring leg of the detent spring (4, 4') is an engaging means (14) for locking engagement with marking means (23, 23'), on the peripheral surface of the adjusting means (5, 6), which are designed as rectangular recesses. However, it is pointed out that in principle, the marking means (23, 23') of an adjusting means may also have an alternative design in the form of marking projections, in this case the detent spring which cooperates with the marking means for locking having a receiving engaging means corresponding to the marking projections.

The base plate of the device for locking has a length (L) extending in the y direction, a width (B) extending in the z direction, and a thickness (D) extending in the x direction. In addition, the printed circuit board (1) has a thickness (D2) extending in the z direction.

The base plate (2) is installed with pretension in an oblong recess (8) in the printed circuit board (1), and is inserted along an insertion direction (E1) for installation in this oblong recess (8). The oblong recess (8) extends into the printed circuit board (1) in the x-y direction, starting from an outer edge of the printed circuit board (1) in the insertion direction (E1).

For pretensioning the base plate (2) in the oblong recess (8), the base plate has a spring clamping tab (10) oriented transversely with respect to the insertion direction (E1). According to FIG. 1, the spring clamping tab (10) points in a direction facing away from the adjusting means (5, 6).

FIG. 1 also shows a detent arm (38) for additional locking, which has detent means (not shown) that cooperate with corresponding detent means on the printed circuit board (1).

Figure 2:
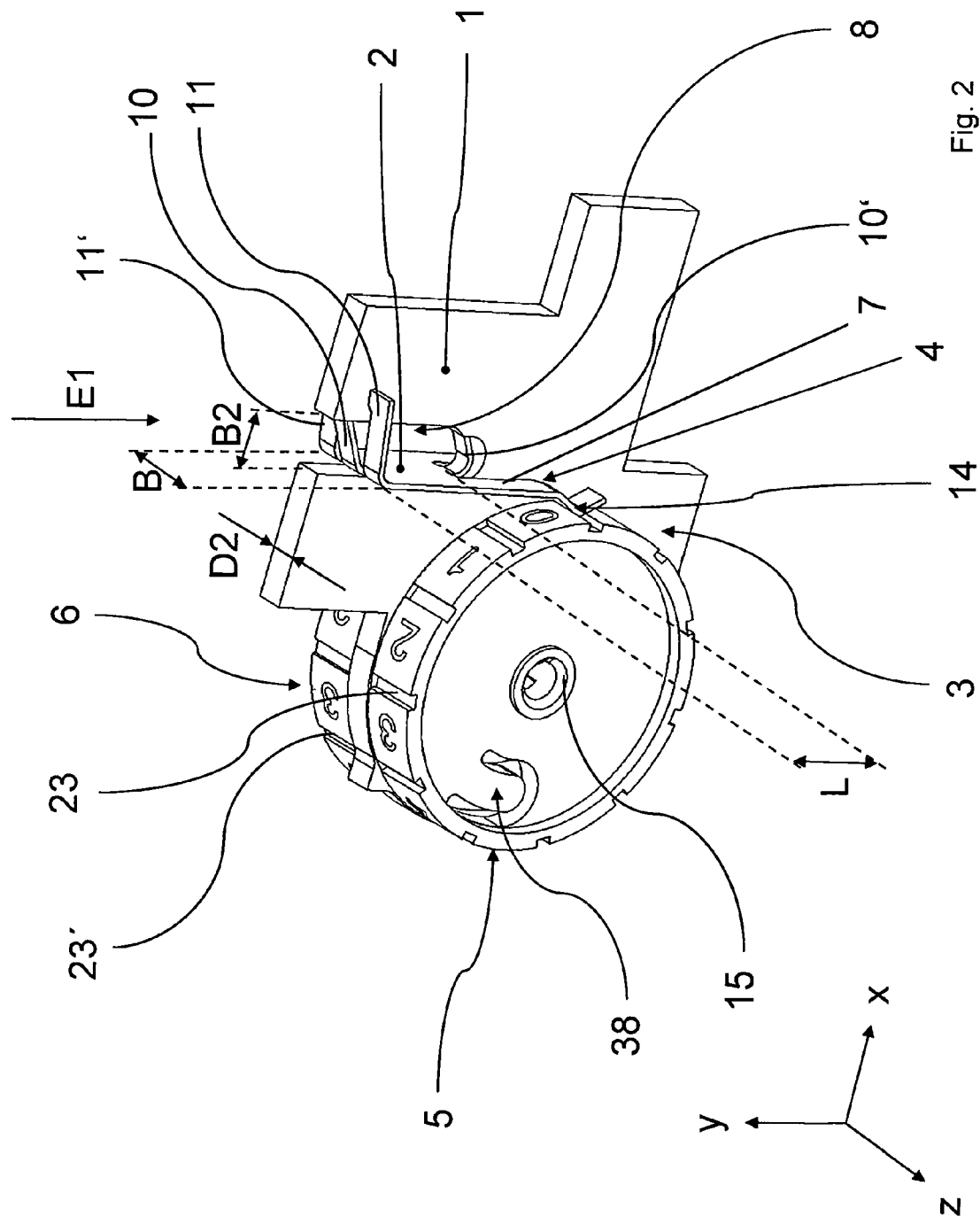
FIG. 2: shows a second embodiment of a locking device according to the invention, with a one-stage oblong recess in a perspective view.

FIG. 2 shows a second embodiment of the device according to the invention for locking adjusting means (5, 6) situated on a printed circuit board (1); in contrast to the device shown in FIG. 1, this embodiment has a wider oblong recess (8) having a width (B2) in the printed circuit board (1). In addition, the base plate (2) has two spring clamping tabs (10, 10') on its two broad sides which are inclined transversely with respect to the insertion direction (E1), and which thus allow improved pretensioning of the base plate (2) of the device according to the invention in the oblong recess (8).

In another departure from FIG. 1, the base plate (2) of the device according to FIG. 2 has a material projection (11, 11') on each side of the printed circuit board (1) on its broad side, the material projection likewise being inclined transversely with respect to the insertion direction (E1) and fixing the base plate (2) in the oblong recess (8) in the z direction.

Figure 3:
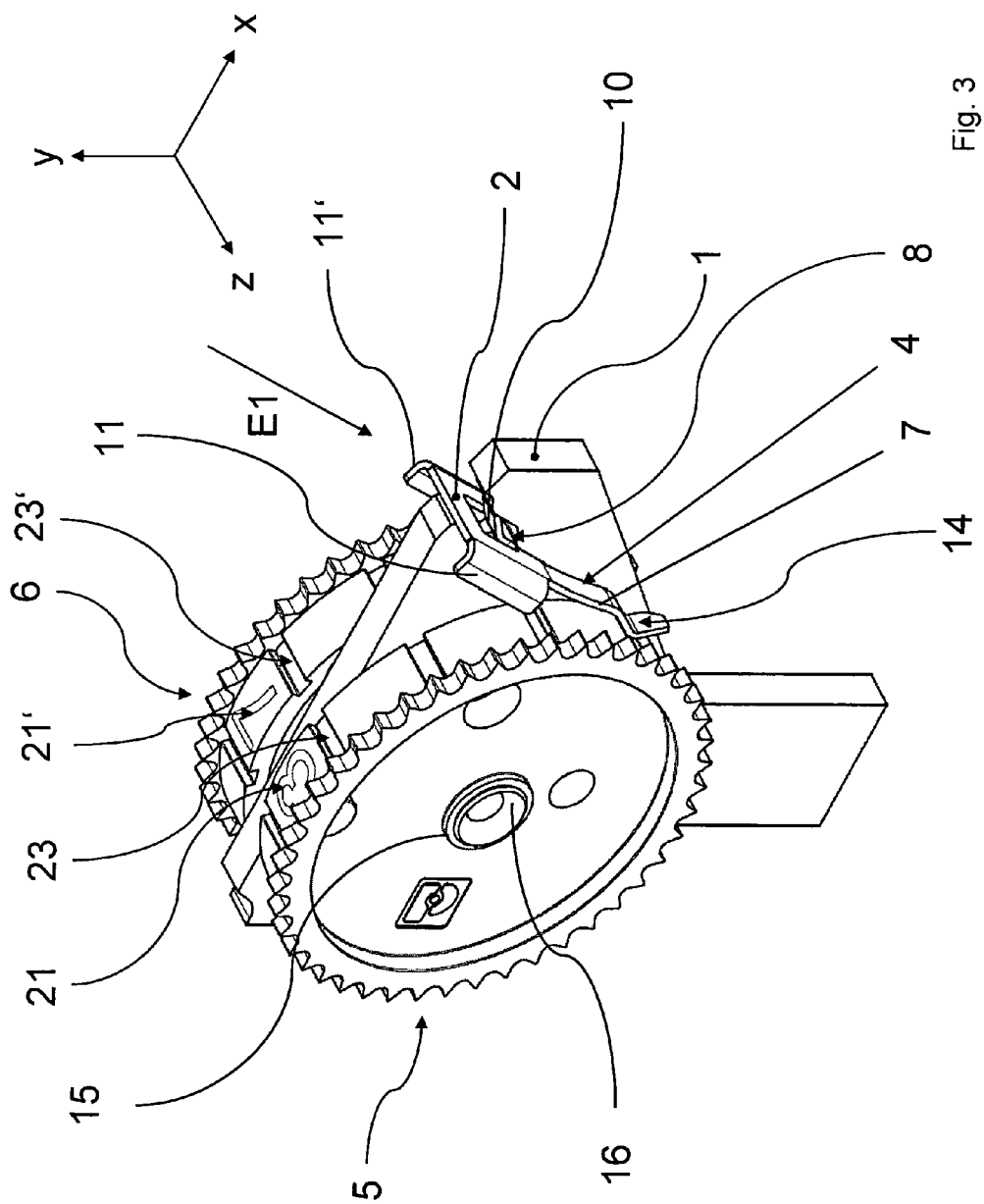
FIG. 3: shows a third embodiment of a locking device according to the invention, with a two-stage oblong recess in a perspective view.
Figure 4:
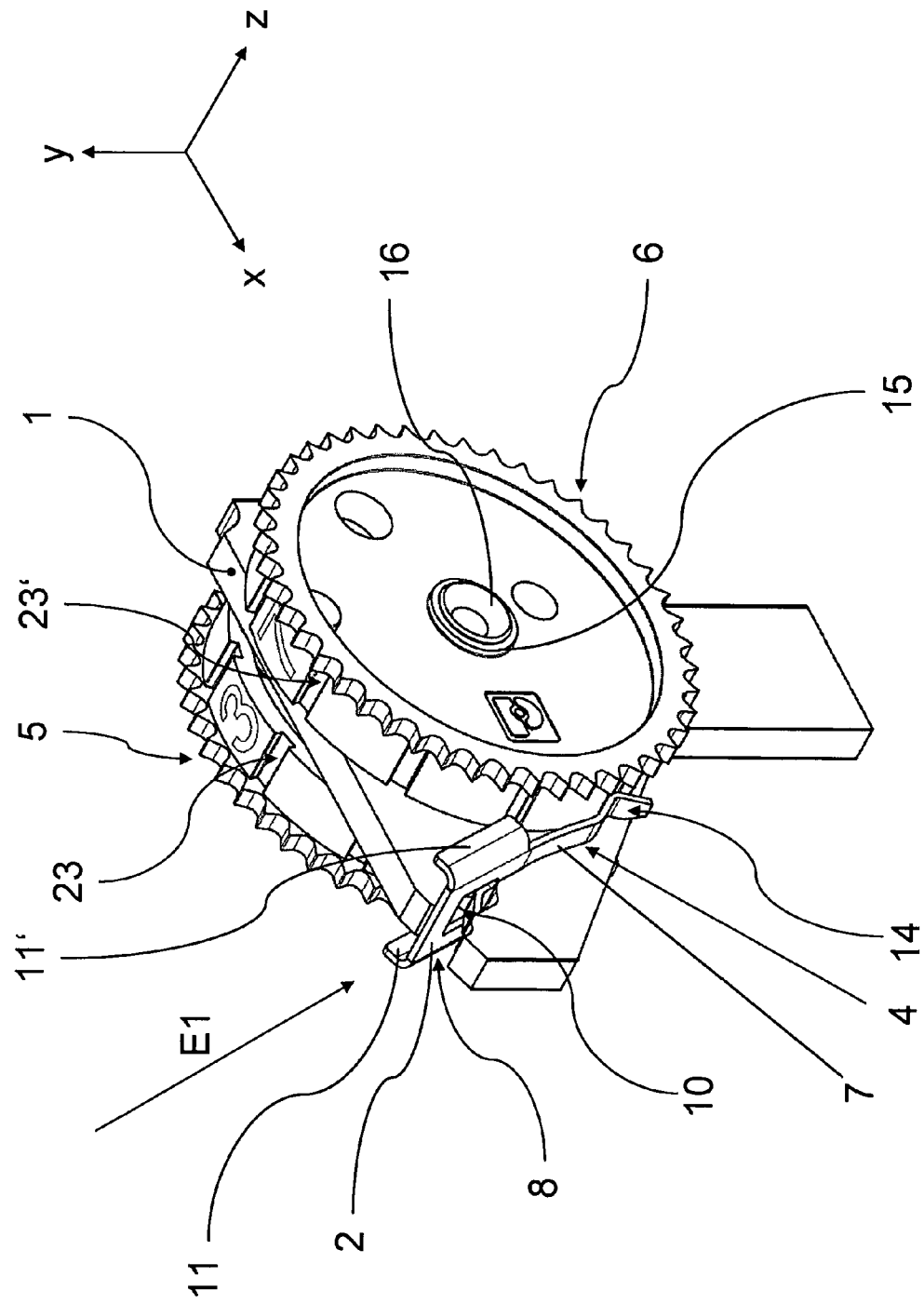
FIG. 4: shows the locking device according to FIG. 3 in another perspective view.

FIG. 3 and FIG. 4 show a perspective view, in each case from a different viewing direction, of a third embodiment of the device according to the invention for locking adjusting means (5, 6), which are mounted on opposite sides of a printed circuit board (1) and in each case fixed, mounted, or attached to same by means of a rivet (16).

Figure 5:
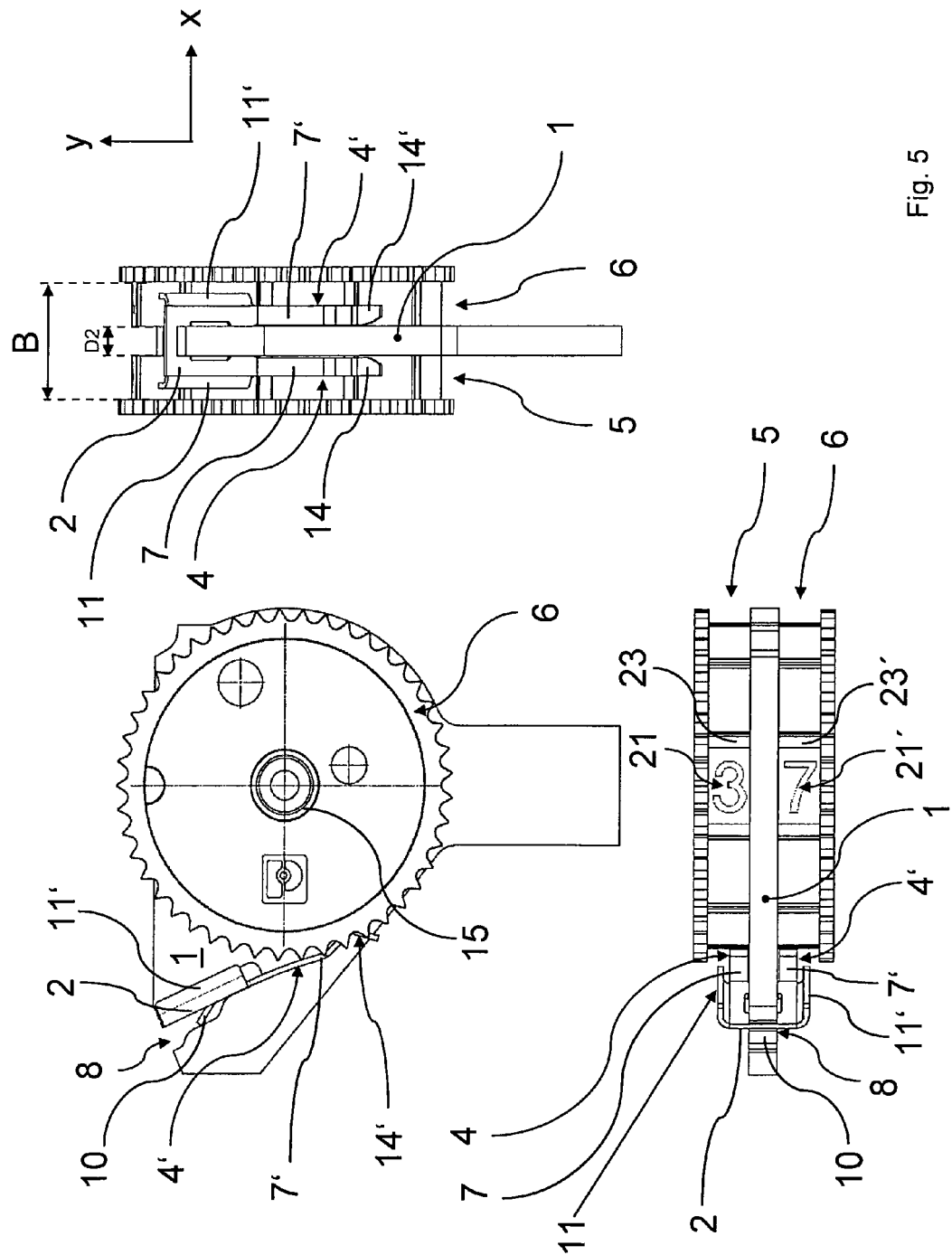
FIG. 5: shows a side view, a front view, and a top view of the locking device according to FIG. 3, FIG. 6: shows the locking device according to FIG. 3 in an exploded view.

FIG. 5 shows the embodiment of the device for locking according to FIG. 3 in a side view, a front view, and a top view.

Figure 6:
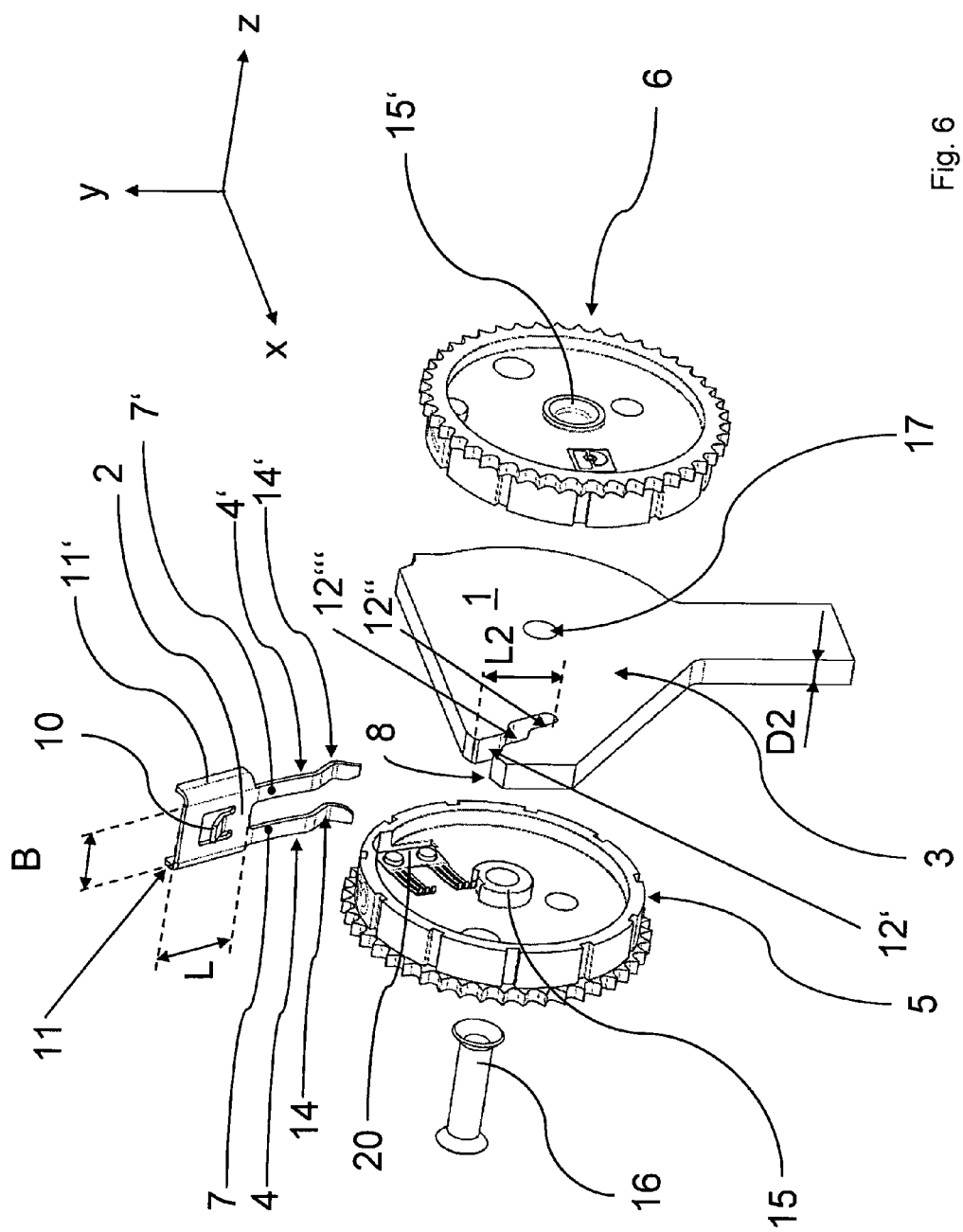

FIG. 6 shows an exploded view of the components of the device according to the invention corresponding to FIG. 3 and FIG. 4, in a perspective view. FIG. 6 also shows an electrical consumer (20), which in each case is situated on the inside of the thumbwheels (5, 6) which function as adjusting means, and is used for transmitting an electrical current between resistance tracks situated in each case on the circuit arrangements (3) on both sides of the printed circuit board (1).

Figure 7:
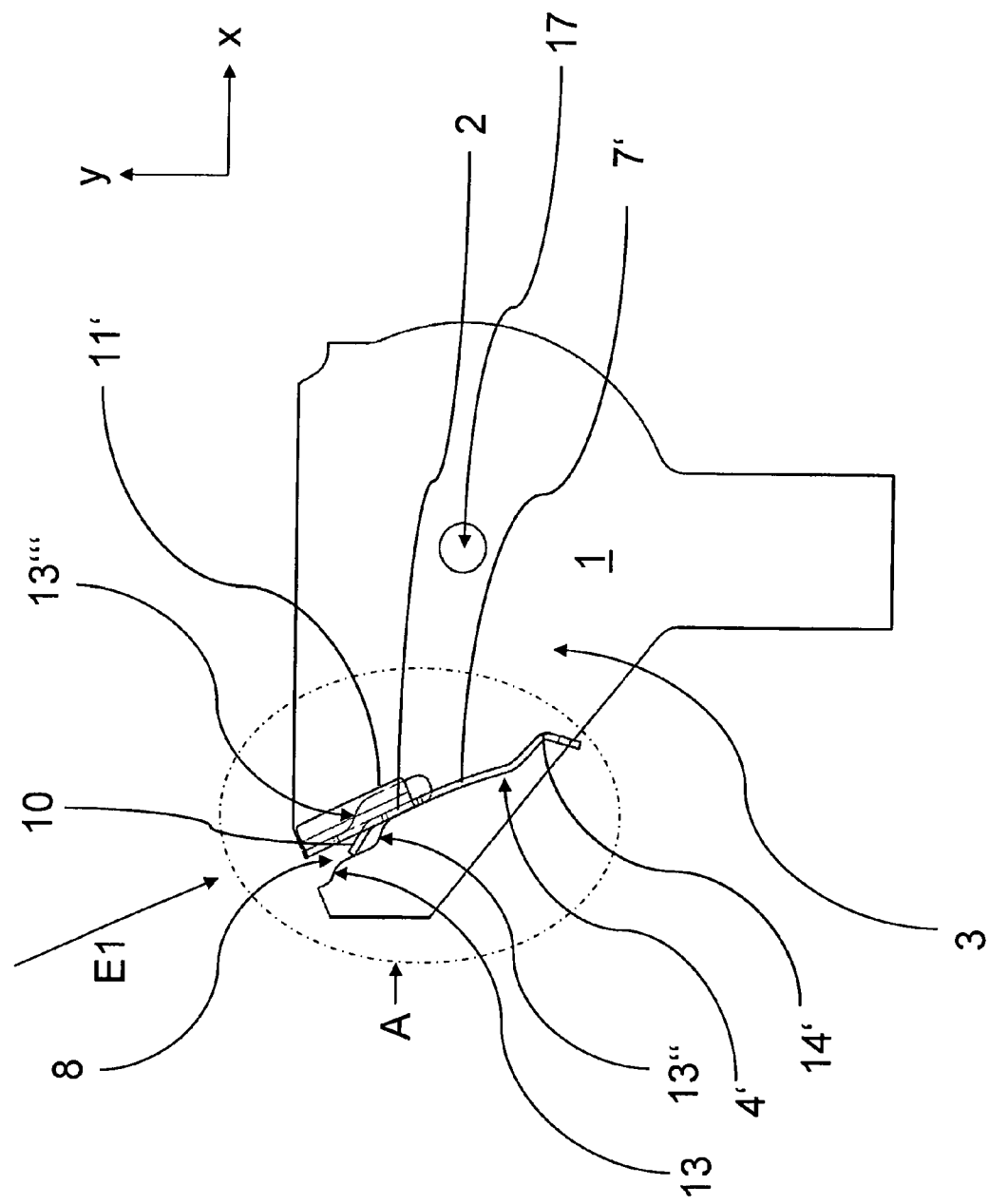
FIG. 7: shows the printed circuit board of the locking device according to FIG. 3 in a side view, without adjusting means.
Figure 8:
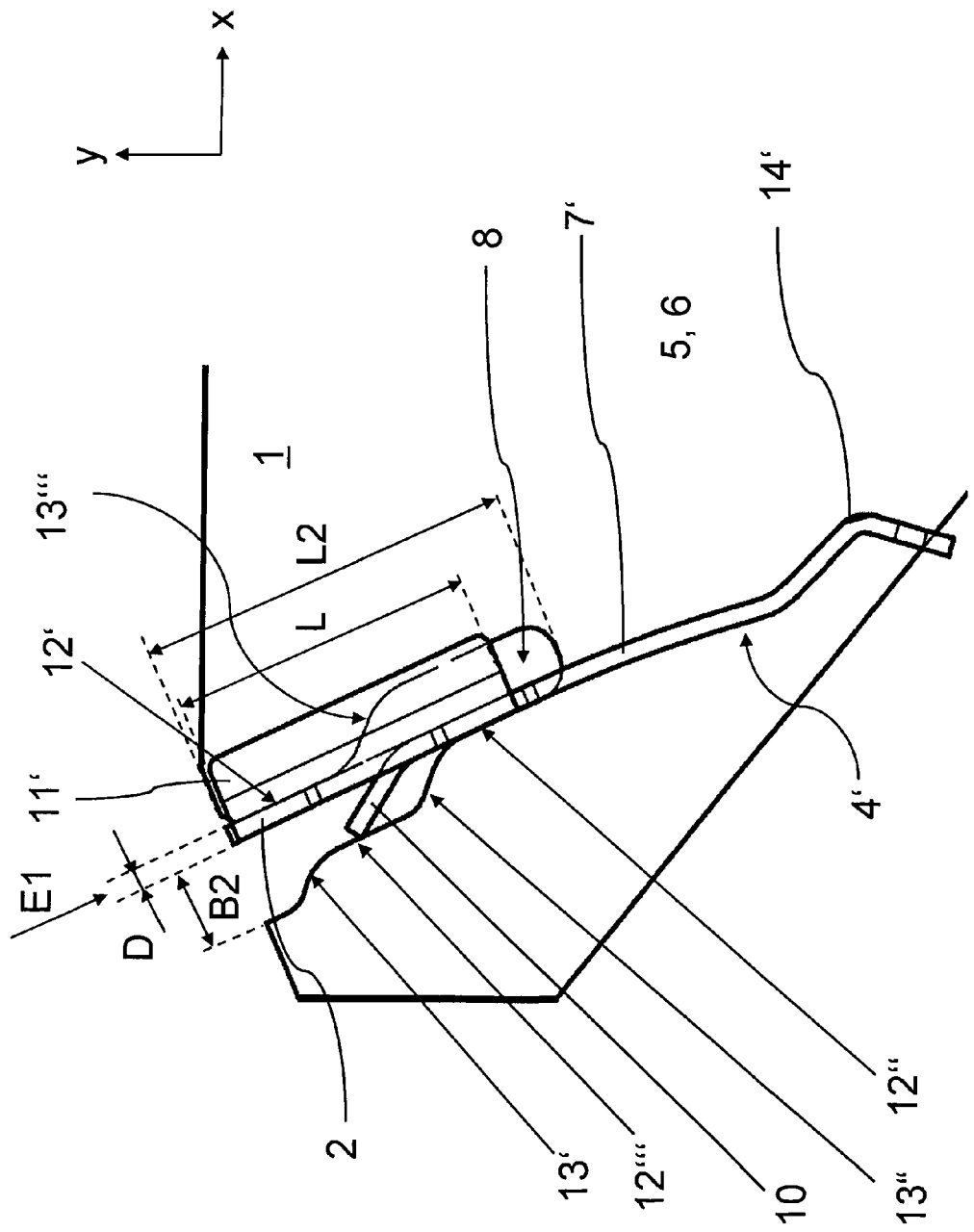
FIG. 8: shows an enlarged view of the oblong recess in the locking device according to FIG. 3, without adjusting means.

FIG. 7 shows this third embodiment in a side view without an adjusting means (5, 6), which allows a view of a hole (17) for accommodating a bearing axis, a bearing, a rivet, or a bearing journal of the adjusting means (5, 6). FIG. 8 shows an enlarged illustration of the partial detail of the third embodiment denoted by "A" in FIG. 7.

Based on this third embodiment, the base plate (2) also has a spring clamping tab (10) formed from the base plate, so that this base plate has an inner recess.

In a further departure from the embodiments according to FIG. 1 and FIG. 2, the third embodiment shows inner surfaces of the oblong recess (8) in the printed circuit board which are provided with a profile having a step-like or stair-like design in the x-y plane. The inner surfaces have planes (12', 12", 12''') which extend parallel to the insertion direction of the base plate, in the insertion direction (E1) a first plane (12') being present in front of a second plane (12"), and a third plane (12''') being present between this first plane (12') and this second plane (12").

In addition, the inner surfaces have planes (13', 13", 13''') oriented in the direction of the adjusting means and/or tangentially with respect to the circular periphery of an adjusting means having a rotatable design.

In an alternative embodiment, the oblong recess may also be profiled in a wave-like manner, for example also in a slightly S-shaped manner.

As is apparent from the figures, planes formed parallel to the insertion direction of the base plate alternate with planes oriented in the direction of the adjusting means and/or tangentially with respect to the circular periphery of an adjusting means having a rotatable design, both opposite inner surfaces of the oblong recess preferably being provided with profiles that are offset with respect to one another.

The number of planes formed by the inner surfaces at two opposite inner surfaces of the oblong recess is different.

The base plate (2) of the device according to the invention for locking once again has a length (L), and is inserted essentially completely into the oblong recess (8) having the length (L2). Once again, detent springs (4, 4') having engaging means (14, 14') mounted on spring legs (7, 7') [are present] on the base plate in the insertion direction for locking engagement in each case with complementary marking means (23, 23') on adjusting means (5, 6).

In addition, a spring clamping tab (10) which abuts against the third plane (12''') oriented in parallel is mounted on the base plate, this plane being formed on the inside of the oblong recess facing the adjusting means (5, 6). As a result, the spring clamping tab (10) pretensions the base plate (2) against the first plane (12') oriented in parallel which is formed on the inside of the oblong recess facing away from the adjusting means (5, 6), and also pretensions the spring leg of the detent spring against the marking means (23') of the adjusting means (6).

The distance in the x-y plane between the first plane (12') oriented in parallel which is formed on the inner surface of the oblong recess (8) facing away from the adjusting means (5, 6), and the second plane (12") oriented in parallel which is formed on the inner surface of the oblong recess (8) facing the adjusting means, is advantageously the minimum distance in the x-y plane, and corresponds essentially to the thickness (D) of the base plate (2).

Figure 9:
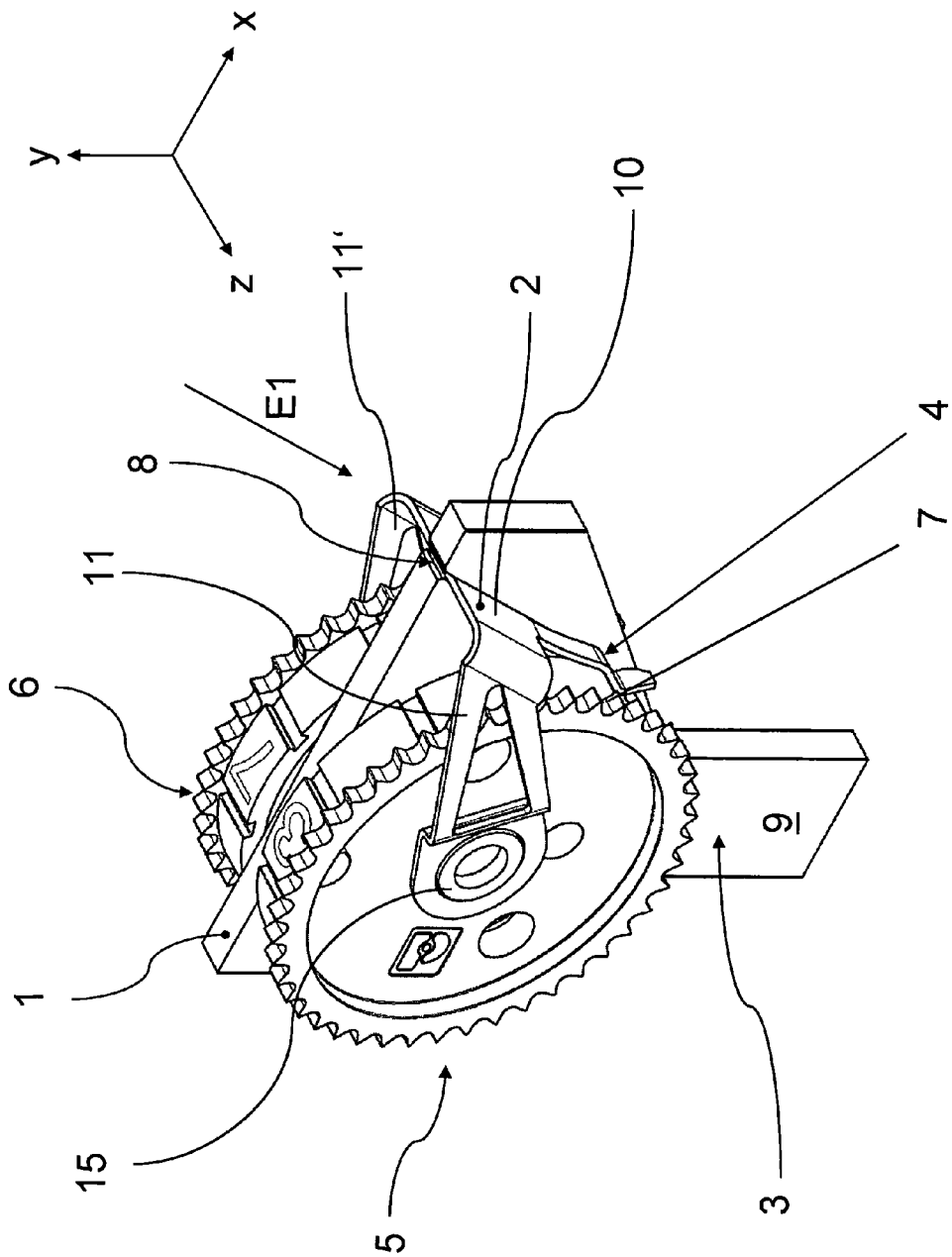
FIG. 9: shows a fourth embodiment of a locking device according to the invention, with a material projection for guiding adjusting means, in a perspective view.
Figure 10:
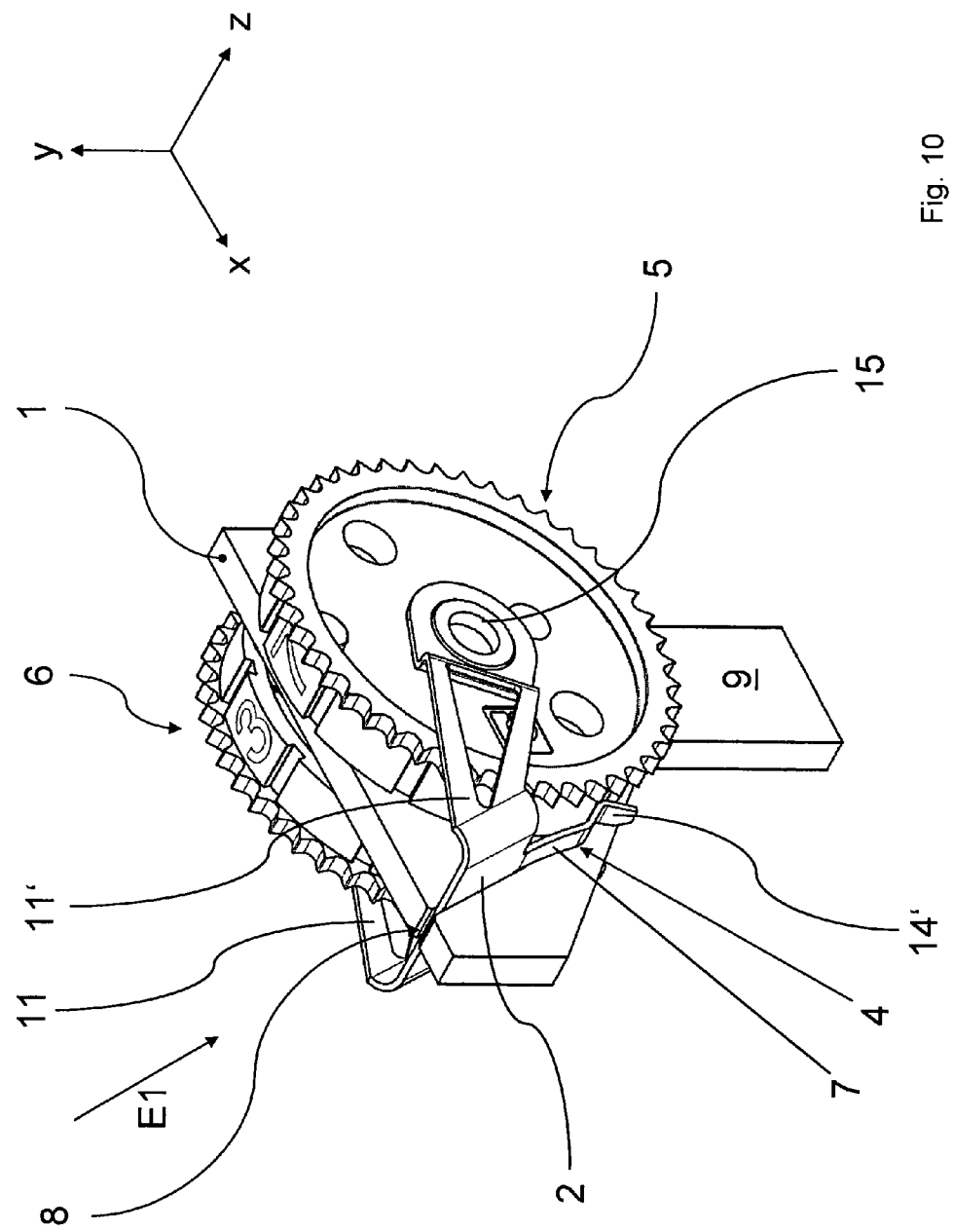
FIG. 10: shows the locking device according to FIG. 9 in another perspective view.
Figure 11:
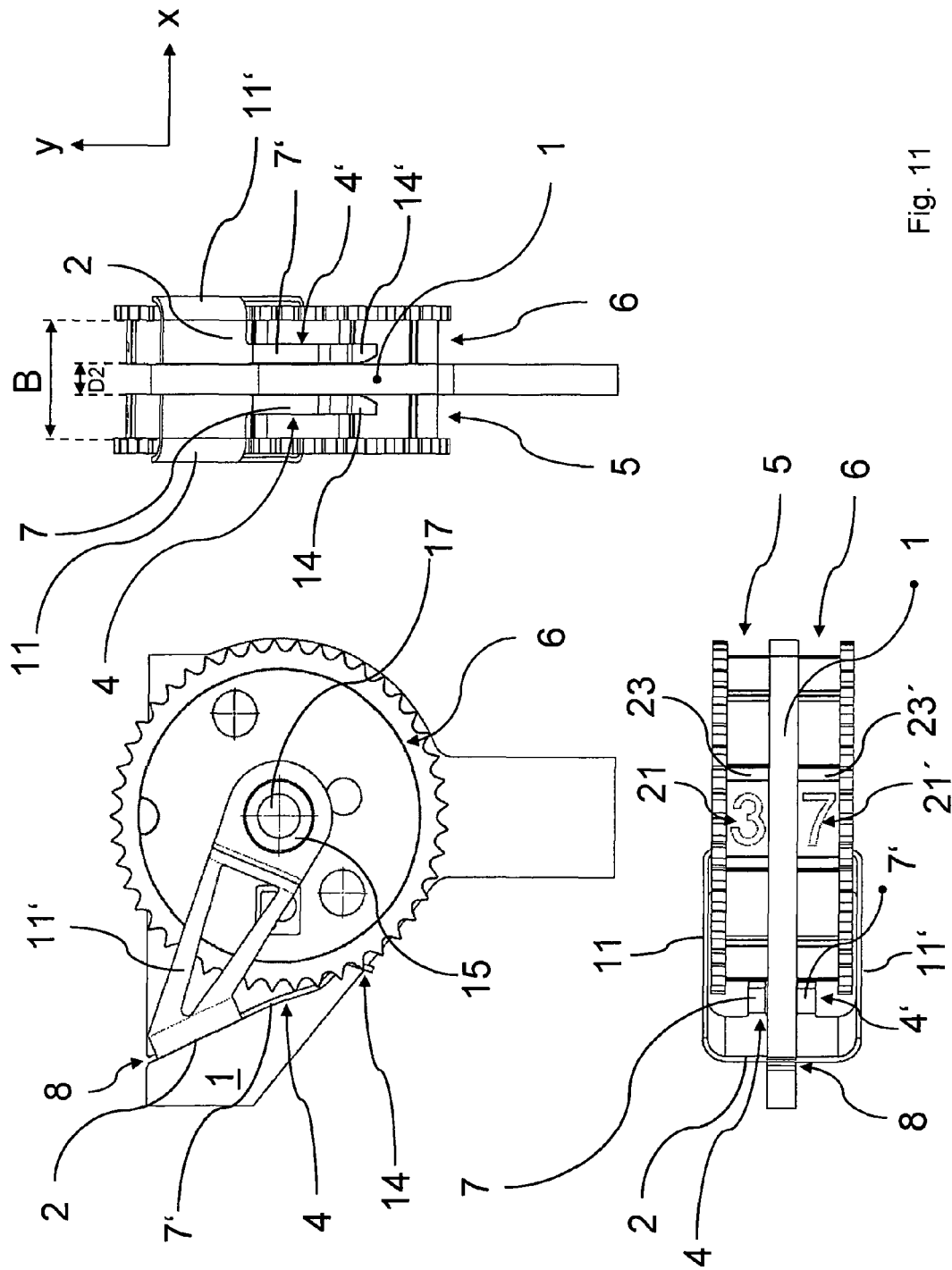
FIG. 11: shows a side view, a front view, and a top view of the locking device according to FIG. 9, FIG. 12: shows the locking device according to FIG. 9 in an exploded view.

A fourth embodiment of the invention is illustrated in FIGS. 9 through 13. FIG. 9 and FIG. 10 show this embodiment in perspective view from a different viewing angle. FIG. 11 shows this embodiment of the device for locking in a side view, a front view, and a top view.

Figure 12:
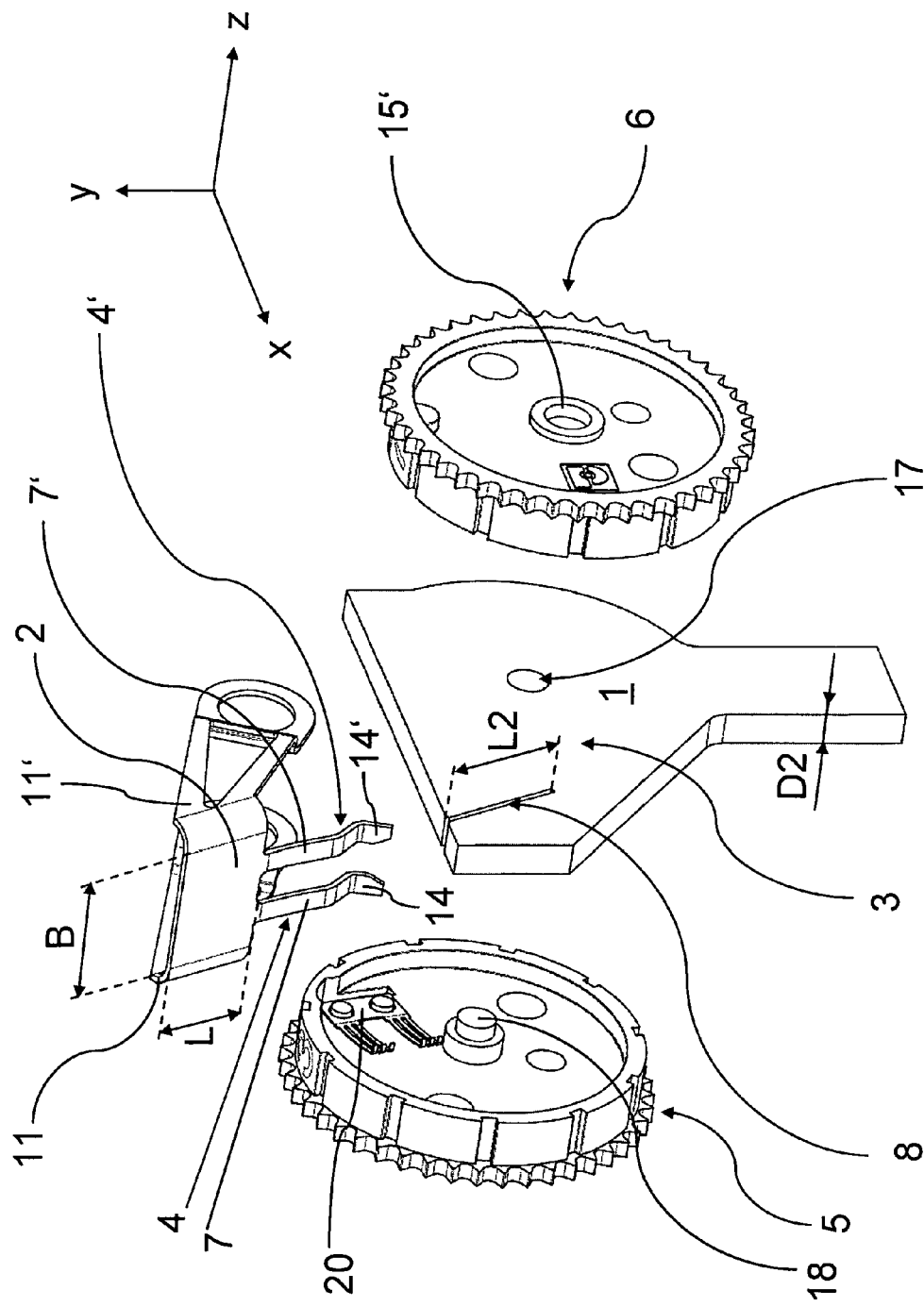

FIG. 12 shows an exploded view and FIG. 13 shows a side view of this embodiment of the invention, without an adjusting means (5, 6), and FIG. 12 also shows an electrical consumer (20) corresponding to FIG. 6 which in each case is situated on the inside of the thumbwheels (5, 6) which function as adjusting means.

The base plate (2) shown in the fourth embodiment is installed in a slitted oblong recess (8) in the printed circuit board (1), and on each of its two longitudinal sides has a material projection (11, 11') which is bent transversely with respect to the plane of the base plate (2), and which is oriented essentially parallel to the plane of the printed circuit board and which guides and preferably fixes the adjusting means (5, 6). In addition, the two material projections (11, 11') each have a wing shape, and on each side of the printed circuit board overlap the sides of the adjusting means (5, 6). The outer ends of the wing-shaped material projections (11, 11') each have a hole for accommodating and guiding a bearing (15) of the adjusting means. The adjusting means (5) are supported in a hole (17) in the printed circuit board via bearing journals 18.

For installing this embodiment of a device for locking, the wing-shaped material projection is bent away from the side of the printed circuit board in the z direction of the printed circuit board, and is pushed or inserted in the insertion direction into the oblong recess in the printed circuit board until the wing-shaped material projection overlaps the adjusting means. The base plate is pushed into the oblong recess until the wing-shaped material projection is centered above the ring-shaped bearing in overlap with the hole thereof, and externally encloses same for guiding, preferably locking with the bearing of the adjusting means for guiding. The spring leg of the detent spring, which is used for locking engagement with the marking means of this adjusting means, is deflected against the elastic force of the adjusting means until the engaging means situated on the spring leg makes locking engagement with the marking means on the circular periphery of the adjusting means. The device is fixed in the printed circuit board in this position, and is preferably held under pretensioning by means of the spring leg.

In an alternative embodiment, instead of a hole for accommodating and guiding a bearing, a guide pin may be formed on the wing, and the guide pin is insertable into this bearing when the wing-shaped material projection overlaps above the ring-shaped bearing, so that the rotatable adjusting means is not only guided, but at the same time also rotatably supported and fixed, by means of the guide pin.

In all of the above-described embodiments which have adjusting means and two corresponding detent springs on the opposite sides of the printed circuit board, it may also advantageously be provided that the distance between the two detent springs on the base plate corresponds essentially to the thickness of the printed circuit board, so that the base plate may already be fixed in the z direction by the detent springs.

Of course, an adjusting means may also be situated on only one side of the printed circuit board, so that a base plate having only one detent spring is sufficient.

LIST OF REFERENCE NUMERALS

1 Printed circuit board
2 Base plate
3 Circuit arrangement
4 First detent spring
4' Second detent spring
5 First adjusting means
6 Second adjusting means
7, 7' Spring leg
8 Oblong recess
9 Printed circuit board contact sites
10, 10' Spring clamping tab
11, 11' Material projection
12' First plane aligned in parallel
12" Second plane aligned in parallel
12'" Third plane aligned in parallel
13', 13", 13'" Tangentially aligned plane
14, 14' Engaging means
15, 15' Bearing
16 Rivet
17 Hole
18 Bearing journal
20 Consumer
21 Marking
23 Marking means
26 Outer peripheral surface
27 Adjusting means edge
38 Detent arm
B Width of base plate
B2 Width of oblong recess
D Thickness of oblong recess
D2 Thickness of printed circuit board
L Length of base plate
L2 Length of oblong recess
E1 Insertion direction of base plate

The invention claimed is:

1. A locking device for locking an adjusting means mounted on a printed circuit board which extends in an x direction and a y direction and has a thickness extending in a z direction, the device comprising:
a substantially flat base plate having a length, a width, and a thickness, to which a detent spring is attached for locking engagement with a marking means of the adjusting means, the detent spring having an oblong spring leg, wherein in the installed state, the base plate is mounted on the printed circuit board and wherein the base plate is introduced with at least a portion of its length into an oblong recess which extends into the printed circuit board in the x-y direction, starting from an outer edge of the printed circuit board in an insertion direction.

2. The device according to claim 1, wherein the elastic force of the first detent spring acts substantially perpendicularly with respect to the plane of the base plate which is defined by its length and width.

3. The device according to claim 1, wherein the plane of the base plate is oriented transversely, at right angles, with respect to the plane of the printed circuit board.

4. The device according to claim 1, wherein the oblong recess over a significant portion of its length passes through the printed circuit board in the z direction.

5. The device according to claim 1, wherein the length of the oblong recess has at least the length of the base plate, and/or the width of the base plate has at least the thickness of the printed circuit board, and/or the width of the oblong recess in the printed circuit board has at least the thickness of the base plate.

6. The device according to claim 1, wherein the adjusting means is a rotatable adjusting means.

7. The device according to claim 1, wherein at least a portion of the base plate has a material projection which is bent transversely with respect to the plane of the base plate.

8. The device according to claim 7, wherein the material projection guides and/or supports the adjusting means.

9. The device according to claim 8, wherein for guiding, a material projection which is bent on a longitudinal side of the base plate is formed in the shape of a wing which extends substantially parallel to the plane of the printed circuit board on one side in such a way that the wing overlaps an adjusting means situated on this side, and the wing has a hole for accommodating and guiding a bearing of this adjusting means.

10. The device according to claim 8, wherein for guiding, a material projection which is bent on a longitudinal side of the base plate is formed in the shape of a wing which extends substantially parallel to the plane of the printed circuit board on one side in such a way that the wing overlaps an adjusting means situated on this side, and the wing has a guide pin so that when the wing-shaped material projection overlaps above a ring-shaped bearing, the guide pin is insertable into this bearing.

11. The device according to claim 1, wherein:
(a) the marking means are formed as marking recesses, and the detent spring has a protruding engaging means which corresponds to the marking recesses, or
(b) the marking means are formed as marking projections, and the detent spring has a receiving engaging means which corresponds to the marking projections, and/or
(c) each of the detent spring, the base plate, and the engaging means is configured as a stamped-bent part made of sheet metal.

12. The device according to claim 1, wherein for pretensioning in the oblong recess, the base plate has a spring clamping tab oriented transversely with respect to the insertion direction this spring clamping tab being formed from the base plate so that this base plate has a central recess.

13. The device according to claim 12, wherein the spring clamping tab points in a direction facing away from the adjusting means in the x and/or y direction.

14. The device according to claim 1, wherein the inner surfaces of the oblong recess in the printed circuit board are provided with a profile that has a step-like or stair-like or also a wave-like design, this type of profile being situated along the x-y plane of the printed circuit board.

15. The device according to claim 14, wherein both opposite inner surfaces of the oblong recess are provided with profiles that are offset with respect to one another.

16. The device according to claim 14, wherein the profile of the oblong recess is configured in such a way that the inner surfaces form planes that are parallel to the insertion direction of the base plate, and also form planes which are oriented in the direction of the adjusting means and/or tangentially with respect to a circular periphery of an adjusting means having a rotatable design.

17. The device according to claim 16, wherein the minimum distance between two planes which are formed at opposite inner surfaces of the oblong recess and offset relative to one another but parallel to the insertion direction substantially corresponds to the thickness of the base plate.

18. The device according to claim 14, wherein the number of planes at the two opposite inner surfaces of the oblong recess is different from each other.

19. The device according to claim 14, wherein the width of the oblong recess is reduced in the insertion direction, and/or the depths of the planes of the steps in the insertion direction are different, and/or the step edges are rounded.

20. The device according to claim 1, wherein a second detent spring for a second adjusting means is mounted on the base plate, and is situated on the side of the printed circuit board opposite from the first adjusting means, and the second detent spring being situated on the side of the base plate opposite from the first detent spring, the second detent spring having mounted an engagement means cooperating with the marking means of the second adjusting means and having a design that is complementary to the marking means of the second adjusting means for locking engagement.

21. The device according to claim 20, wherein:
the detent springs are substantially identical, and/or
the distance between the detent springs on the base plate substantially corresponds to the thickness of the printed circuit board.

22. An electric terminal module comprising:
a plurality of electric contact elements to connect electric conductors,
a housing to accommodate at least one printed circuit board on which a circuit arrangement with a plurality of electric components for performing a predetermined function is arranged, and
a locking device according to claim 1 for locking an adjusting means for changing at least one electric characteristic quantity of the circuit arrangement, whereby at least part of the adjusting means can be operated through an opening in at least one side wall of the housing and can be swiveled or turned from the outside, wherein the adjusting means is mounted on a mount directly onto the printed circuit board.

23. The device according to claim 4, wherein the oblong recess over a significant portion of its length passes through the printed circuit board in the z direction in the manner of a slit or a continuous groove in the printed circuit board.

24. The device according to claim 6, wherein the rotatable adjusting means is a thumbwheel.

25. The device according to claim 6, wherein the insertion direction of the oblong recess is oriented substantially tangentially with respect to a circular periphery of the rotatable adjusting means.

* * * * *